United States Patent
Zapf et al.

(10) Patent No.: US 11,174,130 B2
(45) Date of Patent: Nov. 16, 2021

(54) PULLEY FOR AN ELEVATOR WITH A FRICTION REDUCING COATING AND METHOD FOR MANUFACTURING SAME

(71) Applicant: Inventio AG, Hergiswil (CH)

(72) Inventors: Volker Zapf, Kriens-Obernau (CH); Sascha Hessel, Bingen (DE)

(73) Assignee: INVENTIO AG, Hergiswil (CH)

( * ) Notice: Subject to any disclaimer, the term of this patent is extended or adjusted under 35 U.S.C. 154(b) by 531 days.

(21) Appl. No.: 15/999,240

(22) PCT Filed: Feb. 14, 2017

(86) PCT No.: PCT/EP2017/053191
§ 371 (c)(1),
(2) Date: Aug. 16, 2018

(87) PCT Pub. No.: WO2017/140635
PCT Pub. Date: Aug. 24, 2017

(65) Prior Publication Data
US 2019/0106294 A1    Apr. 11, 2019

(30) Foreign Application Priority Data
Feb. 16, 2016  (EP) .................................. 16155887

(51) Int. Cl.
*B66B 15/02*    (2006.01)
*C23C 16/02*    (2006.01)
(Continued)

(52) U.S. Cl.
CPC .......... *B66B 15/02* (2013.01); *C23C 16/0254* (2013.01); *C23C 16/27* (2013.01);
(Continued)

(58) Field of Classification Search
CPC ...................................................... B66B 15/02
See application file for complete search history.

(56) References Cited

U.S. PATENT DOCUMENTS 6,994,474 B2   2/2006   Kinno et al.
7,140,778 B2  11/2006   Hokkirigawa et al.
(Continued)

FOREIGN PATENT DOCUMENTS

CN    1388327 A    1/2003
CN    1935616 A    3/2007

*Primary Examiner* — William D Young
(74) *Attorney, Agent, or Firm* — William J. Clemens; Shumaker, Loop & Kendrick, LLP

(57) ABSTRACT

A pulley for an elevator includes a base body made e.g. from steel and having a rotation-symmetrical circumferential surface. Additionally, a friction reducing coating is applied to the circumferential surface of the base body. Due to the friction reducing coating and, optionally, due to additionally smoothing the base body's circumferential surface before depositing the coating, a very low friction between an outside surface of the pulley and a contacting surface of a suspension traction member may be obtained. Thereby, guiding characteristics of the pulley may be improved and/or alignment requirements upon installation of the pulley may be relaxed. Preferably, the coating may comprise diamond-like carbon (DLC) or chromium nitride (CrN) such that the coating provides for superior wear resistance, slickness, corrosion protection and electrical characteristics.

19 Claims, 2 Drawing Sheets

(51) Int. Cl.
*C23C 16/27* (2006.01)
*C23C 16/34* (2006.01)
*C23C 16/50* (2006.01)
*C01B 32/05* (2017.01)
*C10N 10/06* (2006.01)
*C01B 21/06* (2006.01)

(52) U.S. Cl.
CPC .............. *C23C 16/34* (2013.01); *C23C 16/50* (2013.01); *C01B 21/062* (2013.01); *C01B 32/05* (2017.08); *C10N 2010/06* (2013.01)

(56) References Cited

U.S. PATENT DOCUMENTS

| | | | |
|---|---|---|---|
| 7,172,343 B2 | 2/2007 | Kinno et al. | |
| 2003/0025109 A1* | 2/2003 | Baranda | B66B 15/04 254/266 |
| 2006/0070822 A1 | 4/2006 | Osada et al. | |
| 2007/0062762 A1* | 3/2007 | Ach | B66B 7/062 187/266 |
| 2008/0289912 A1* | 11/2008 | Perron | B66B 15/04 187/411 |

* cited by examiner

PULLEY FOR AN ELEVATOR WITH A FRICTION REDUCING COATING AND METHOD FOR MANUFACTURING SAME

FIELD

The present invention relates to a pulley for an elevator and to an elevator comprising such pulley. Furthermore, the invention relates to a method for manufacturing a pulley for an elevator.

BACKGROUND

Elevators are generally adapted for transporting people or items in a vertical direction. Typically, the elevator comprises a car for accommodating the people or items. The car is generally held by a suspension traction member (sometimes also referred to as suspension traction medium—STM) such as one or more ropes or belts. The suspension traction member may be driven by a driving machine typically comprising a traction sheave driven by an electric motor. A counterweight may be provided and may be suspended to the same suspension traction member suspending the car. The car and/or the counterweight may be held by the suspension traction member via one or more pulleys. For such purpose, the pulley has a rotation-symmetrical circumferential surface and is fixed in a pivotable manner to the car or counterweight, respectively, while the suspension traction member is wound along its circumferential surface.

Conventionally, pulleys have been provided with a base body being made from a material having a high mechanical load capacity. In most cases, the base body was made of a metal such as steel. The base body was manufactured using manufacturing processes such as turning in order to generate its rotation-symmetrical circumferential surface. As a result of such manufacturing processes, the circumferential surface of the base body had a macroscopically smooth surface such that the suspension traction member being displaced along this circumferential surface is not substantially damaged during operation of the elevator.

However, it has been observed that when using conventional pulleys for an elevator, problems may occur during extended operation of the elevator such that repeated monitoring and/or shortened service intervals may be necessary. Particularly, problems with respect to inadequate guiding or misalignment of a suspension traction member being displaced along the circumferential surface of the pulley and/or with respect to longevity of the pulley have been observed. Furthermore, noise problems have been observed.

SUMMARY

Accordingly, there may be a need for a pulley for an elevator at least partly overcoming problems observed with conventional pulleys, particularly problems with respect to guidance of a suspension traction member and/or with respect to longevity and/or with respect to noises occurring during operating the elevator. Furthermore, there may be a need for an elevator comprising such pulley and for a method for producing such pulley.

According to an aspect of the present invention, a pulley for an elevator is proposed, the pulley comprising a base body having a rotation-symmetrical circumferential surface. Furthermore, a friction reducing coating is applied to the circumferential surface of the base body.

According to a second aspect of the invention, an elevator comprising a car and/or a counterweight being held by a suspension traction member via a pulley according to an embodiment of the first aspect of the invention is proposed.

According to a third aspect of the invention, a method for manufacturing a pulley for an elevator is proposed, the method comprising the following steps: First, a base body having a rotation-symmetrical circumferential surface is provided. Then, a friction reducing coating is applied to the circumferential surface of the base body.

Ideas underlying embodiments of the present invention may be interpreted as being based, inter alia, and without limiting the scope of the invention, on the following observations and recognitions:

As indicated in the introductory portion, problems have been observed upon using conventional pulleys being made with a metallic base body in an elevator. One of these problems is that the suspension traction member has to be guided by the pulley upon being displaced along the circumferential surface of the base body such that the suspension traction member does not laterally displace. Without such guidance, the suspension traction member could move along the surface of the base body in a lateral direction, i.e. in a direction parallel to the rotation axis of the base body. This could result in increased wear or, in a worst case, in the suspension traction member laterally falling-off from the pulley. Furthermore, noises may occur in case the suspension traction member is guided along the circumferential surface of the pulley e.g. in an inclined direction, i.e. in a direction not exactly rectangular to the rotation axis of the base body. In order to avoid such negative effects, the pulleys in an elevator generally have to be precisely aligned concerning their location and/or orientation with respect to the suspension traction member. Any significant misalignment of the pulleys may result, inter alia, in insufficient guidance of the STM and/or generation of noises.

It has now been observed that alignment requirements may be substantially released by providing the base body of the pulley with a friction reducing coating. Such friction reducing coating may provide for reduced friction between the circumferential surface of the pulley, on the one side, and the suspension traction member, on the other side. While substantive friction is generally necessary between the suspension traction member and a traction sheave being used for actively driving the suspension traction member, it has been observed that friction between a suspension traction member and a pulley being only passively driven by the suspension traction member should be as low as possible. In other words, it has been found that by reducing the friction between the suspension traction member and the surface of the pulley which is contacted by the STM, deviations from an adequate lateral guidance of the STM may be avoided or at least reduced. Therein, on the one hand, adequate high friction has to be achieved between the traction sheave and the suspension traction member but, on the other hand, sufficiently low friction should be established between the pulleys and the suspension traction member. Thus, it appears to be generally not convenient to provide a friction reducing layer on top of the suspension traction member or on top of a traction surface of a drive sheave.

Accordingly, it is suggested to provide a pulley with a base body providing for a required mechanical load-bearing capacity and to provide the pulley additionally with a friction reducing coating. The base body may be made with a metal such as steel. Its rotation-symmetrical circumferential surface may be generally cylindrical on a macroscopic scale, the base body may have a same geometry as base bodies applied for conventional pulleys. The friction reducing coating may be adapted such as to significantly reduce a friction between the circumferential surface of the pulley and a surface of a suspension traction member when compared to a configuration in which the surface of the suspension traction member does not contact the friction reducing coating but an uncoated surface of the base body.

According to an embodiment, the friction reducing coating may have a static coefficient of friction µ to steel of between 0.02 and 0.2, preferably of between 0.04 and 0.1.

Therein, the coefficient of friction is a dimension-less scalar value describing a ratio of a force of friction between two bodies and a force pressing these bodies together. Generally, the coefficient of friction is a material property or, more precisely, a system property (as it may depend from environmental conditions such as temperature as well as on geometric properties of an interface between the materials). Accordingly, the static coefficient of friction of a material is generally indicated for a specific case in which a material mechanically contacts another material. In many cases, the static coefficients of friction of a material are indicated with respect to a contact to steel.

In the present case, such static coefficient of friction of the friction reducing coating upon contact to steel should be between 0.02 and 0.2. With such low static coefficient of friction, the friction reducing coating may provide for a low friction between the circumferential surface of the pulley and a mechanically contacting surface of a traction suspension member being typically provided with a cover material being a polymer such as polyurethane.

Furthermore, it has been found to be beneficial to optimize the characteristics of the friction reducing coating with respect to a ratio of its static coefficient of friction and its dynamic coefficient of friction. Particularly, it has been found that a difference between the static coefficient of friction and the dynamic coefficient of friction should be as small as possible and should be preferably less than 0.2, more preferably less than 0.1 or even less than 0.05. Such small differences may help in that, for enabling the suspension traction member to glide or slip along the surface of the pulley, no substantially high static coefficient of friction has to be overcome. Thereby, for example problems such as noise generation occurring when the suspension traction member abruptly transits from an adhesion mode to a gliding mode may be released.

Specifically, a friction between polyurethane and steel is relatively high with a static coefficient of friction being typically larger than 0.6. Typically, also the dynamic coefficient of friction between polyurethane and steel is larger than 0.6. By applying the friction reducing coating to the steel base body, the friction between the circumferential surface of the pulley and a polyurethane cover of a suspension traction member may be reduced by at least 20%, preferably by approximately 50%, wherein a target value for the static coefficient of friction between the friction reducing coating and the polyurethane cover may be µ=0.35±0.1.

According to an embodiment, the friction reducing coating may be a thin film layer. Such thin film layer typically has a very small thickness of generally less than 500 µm, typically less than 200 µm, preferably less than 100 µm and more preferably less than 50 µm or even less than 10 µm. Such thin film layer may be produced with various materials or material compositions. Furthermore, such thin film layer may be deposited using various deposition methods such as gas phase deposition or vapor phase deposition (PVD—physical vapor deposition or CVD—chemical vapor deposition). Particularly, such thin film layers may be generated beneficially with a layer thickness which is substantially more homogeneous than layers deposited e.g. with galvanic procedures.

According to an embodiment, the friction reducing coating comprises a layer of diamond-like carbon (DLC). Alternatively, the friction reducing coating may comprise a layer of chromium nitride (CrN).

Diamond-like carbon is a class of amorphous carbon material that displays some typical properties of diamond and may generally be applied as coatings to bodies made of other materials such that these bodies may benefit from the properties of the diamond-like carbon. DLC generally exists in different forms and contains significant amounts of $sp^3$ hybridized carbon atoms. Other components and fillers such as hydrogen, graphitic $sp^2$ carbon and/or metals may be added to the DLC. As implied by the name "diamond-like carbon", a layer or coating of DLC may provide some of the properties of diamond to surfaces of almost any other material. For example, such desirable qualities may be hardness, wear resistance and/or slickness. For example, coefficients of friction of a DLC film against polished steel have been reported to range from 0.05 to 0.2. Characteristics of a DLC layer may highly depend on various parameters such as deposition parameters, coating thickness, interlayer thickness, plasma treatment, etc.

It has been found that properties of a pulley for an elevator may be significantly improved when its steel base body is coated with a thin layer of DLC. On the one hand, the DLC may provide for a very low coefficient of friction, particularly to a polyurethane cover of a suspension traction member, thereby improving guiding characteristics of the pulley. On the other hand, the DLC coating may have a very high hardness thereby improving, inter alia, wear resistance of the pulley such that, for example, reduced abrasion occurs at the pulley. Furthermore, a DLC coating may provide for a good corrosion protection for the underlying base body. Additionally, it has been found that a DLC coating may be deposited on the base body with a very good adhesion thereto such that there is a very low risk of portions of the friction reducing coating peeling off or blistering off from the base body. Without such superior adhesion, particles released from the friction reducing coating could be transferred to the suspension traction member and could provoke damages or increased wear at other components of the elevator such as a traction sheave. Furthermore, released particles could increase a contamination resulting in increased slippage between the traction sheave and the traction suspension member.

As an alternative, the base body of the pulley may be coated with a thin layer of chromium nitride (CrN) forming the required friction reducing coating. Similar to the above DLC layers, such CrN layer may significantly reduce the coefficient of friction (both static as well as dynamic) between the pulley and the suspension traction member. Therein, a difference between the static coefficient of friction and the dynamic coefficient of friction for such CrN layer may even be smaller than in case of the DLC layer. Typically, such CrN layer may have a thickness of less than 10 µm, for example about 4 µm.

According to embodiments of the invention, the coating may be applied to the circumferential surface of the base body such as to have a homogeneous thickness throughout the entire circumferential surface.

For example, the coating may be applied using chemical vapor deposition (CVD). As a specific example, the coating may be applied using plasma assisted chemical vapor deposition (PACVD).

In contrast to some other deposition techniques, chemical vapor deposition may allow for depositing coating layers with a very homogeneous thickness. Particularly, when a surface to be coated is not flat and smooth on a microscopic scale but has for example a texture, other deposition techniques such as galvanic deposition may result in more material being deposited at tips than in grooves whereas CVD may allow for a homogeneous deposition with uniform thickness throughout the entire surface. Providing the coating with such homogeneous thickness may be beneficial as, for example, a desired surface texture on the circumferential surface of the base body is not substantially modified upon applying the coating.

For example, according to an embodiment, the circumferential surface of the base body may comprise a non-flat profile with a surface texture with circumferential grooves having for example a V-shaped or a U-shaped cross section. The grooves of such surface texture are generally provided for improving guidance characteristics when a suspension traction member is moved along the circumferential surface of the pulley. Dimensions of such surface textures may be in a sub-millimeter range to few-millimeter range. It has been found that particularly pulleys having a base body with such surface texture may, on the one hand, provide for good guidance of a suspension traction member but, on the other hand, may be specifically susceptible to any misalignment. While it has been found that providing a friction reducing coating to the circumferential surface of the base body may reduce such susceptibility to misalignment, it may be beneficial to provide such coating with a homogeneous thickness in order to not substantially modify the surface texture of the base body's surface.

Particularly, the thickness of the coating may advantageously be between 1 µm and 10 µm, preferably between 2 µm and 4 µm. Such relatively thin coatings may be sufficient for significantly improving characteristics of the pulley. Particularly, when the coating comprises diamond-like carbon, thin layers of coating may already provide for substantially reduced friction, increased wear resistance, reduced corrosion, etc.

According to embodiments of the invention, the circumferential surface of the base body may be provided with a surface roughness with a roughness value Rz smaller than 5 µm (Rz<5 µm), preferably with a roughness value Rz smaller than 2.5 µm (Rz<2.5 µm). In other words, before coating the circumferential surface of the base body, this surface should preferably have a roughness value Rz smaller than 2.5 µm. Such surface roughness may be obtained for example by specifically smoothing or deburring the circumferential surface of the base body prior to applying the friction reducing coating.

Such smoothing may be performed for example by vibratory grinding or, more preferably, by using stream finishing. Alternatively or additionally, the smoothing may be performed with glass bead blasting. All these smoothing techniques may optionally be followed by a polishing step.

Particularly, when the circumferential surface of the base body has been pre-treated in such smoothing manner, an outside surface of the friction reducing coating forming a contact surface of the pulley may be provided with a surface roughness with a roughness value Rz smaller than 2 µm, preferably a roughness value Rz smaller than 1 µm. In other words, after coating the circumferential surface of the base body, the outside surface of the base body coated with the friction reducing coating should preferably have a roughness value Rz smaller than 1 µm.

It has been found that, while suitably selecting the material and characteristics of the friction reducing coating may already provide for a reduced friction between a pulley and a suspension traction member, microscopic surface characteristics of the circumferential contact surface of the pulley may additionally influence a resulting friction between the pulley and the STM. Particularly, it has been found that by reducing the surface roughness at the contact surface of the pulley to very low values, a desired low friction between the pulley and the STM may be supported. However, upon conventionally manufacturing base bodies for pulleys using techniques such as turning, resulting surfaces typically have a higher surface roughness such that subsequent treatment of the circumferential surface may be necessary in order to sufficiently reduce the surface roughness to Rz values smaller than e.g. 5 µm.

One possibility for reducing such surface roughness is vibratory grinding (sometimes also referred to as vibratory finishing) being a type of mass finishing manufacturing processes used to deburr, radius, descale, burnish, clean and/or brighten large numbers of work pieces. Generally, in vibratory grinding, specifically shaped pellets of media and the work pieces are placed into a tub of a vibratory tumbler. The tub of the vibratory tumbler and all of its contents are then vibrated in a batch-type operation. The vibratory action causes the media to rub against the work pieces such as to smoothen their surfaces and reduce their surface roughness.

Stream finishing is another technique for smoothing surfaces and thereby reducing their roughness on an industrial application scale. Advantageous results may be obtained due to high processing forces harnessed by a specifically adapted machine such that for example material may be removed more selectively and faster than with other finishing technologies: Stream finishing may be applied for deburring and mirror-finish polishing, to smoothing and polishing, as well as edge rounding. Stream finishing machines are provided for example by OTEC Präzisionsfinish GmbH, Germany.

As a further alternative, the surface roughness may be reduced using glass bead blasting processes. Therein, small or even microscopic particles are blasted onto the surface to be smoothed in order to e.g. abrade uneven structures. The size and/or energy of the particles may be selected depending on the size of structures to be abraded. Particularly, in order to smoothen the surface of a pulley comprising circumferential grooves on its outer surface, it may be helpful to blast the particles onto the outer surface in a nonrectangular angle such as to, on the one hand, provide for a sufficient impact of the particles and, on the other hand, allow for blasting deeply and preferably homogeneously into the grooves.

It may be noted that the term "surface roughness" (sometimes also shortened as "roughness") shall relate herein to a component of surface texture being quantified by deviations in a direction of a normal vector of a real surface from its ideal form. If such deviations are large, the surface is rough, if they are small, the surface is smooth. In other words, roughness may be typically considered to be a high-frequency, short-wavelength component of a measured surface. However, in practice it is often necessary to know both an amplitude and a frequency to ensure that surface characteristics fit to a specific purpose.

Generally, surface roughness may be quantified by various types of profile roughness parameters. The roughness parameter Rz is used herein to specify desired surface characteristics of the base body and/or the coating, thereby specifying characteristics of the contact surface of the pulley. Rz may be defined as indicating an average distance between a highest peak and a lowest valley in a specific sampling length (see ASME Y14.36M-1996 surface texture symbols). Surface roughness measurements are indicated for example in ISO 25178. Another frequently used roughness parameter is Ra.

Expressed in terms of such roughness parameters, an uncoated base body of a pulley may, after suitable pre-treatment such as vibratory grinding or stream finishing, preferably have a roughness of Rz<2.5 μm (Ra<0.4 μm) whereas a pulley having a base body coated with a friction reducing coating comprising for example a layer of diamond-like carbon may have a reduced roughness of Rz<1 μm (Ra<0.15 μm).

According to an embodiment, the friction reducing coating may have a microhardness of at least 10 GPa, preferably at least 20 GPa. Such coating with a very high microhardness may provide for a superior wear resistance for the pulley. For example, such hard coatings may be obtained using diamond-like carbon.

It may be noted that indentation hardness tests are used in mechanical engineering to determine a hardness of a material to deformation. Several such tests exist wherein the examined material is indented until an impression is formed. The term "microhardness" is widely employed to describe the hardness testing of materials with low applied loads. Sometimes, also the term "microindentation hardness testing" is used. Therein, a diamond indenter of specific geometry is impressed into a surface of a test specimen using a known applied force of e.g. 1 to 1000 gf. Microindentation tests typically have forces of 2 N (roughly 200 gf) and produce indentations of about 50 μm.

According to embodiments of the present invention, the friction reducing coating may comprise a multilayer structure with an inner layer having a lower hardness than an outer layer.

With such multilayer structure, the coating may have an increased mechanical resistivity, hardiness and/or durability. The inner layer of the coating, i.e. the layer closer to the surface of the base body, may provide for a certain mechanical flexibility or compliance whereas the outer layer may provide for a desired high hardness and therefore for a superior wear resistance. Without the softer inner layer, a risk for peeling-off or blistering of the coating may be higher. Each of the inner and the outer layer may be very thin, for example in a range of sub-micrometers to a few micrometers. The hardness of the outer layer and the inner layer may significantly differ, for example by a factor of 2, a factor of 10 or even more.

Specifically, the inner layer may comprise chromium (Cr), chromium nitride (CrN), chromium carbide (CrC) and/or hydrogenated amorphous Carbide (a-C:H).

Particularly, the inner layer itself may comprise a multilayer structure. For example, a thin layer of chromium may be deposited directly on the circumferential surface of the metal base body and may serve as an adhesion layer. Onto such chromium layer, a layer comprising a mixture of chromium and chromium nitride or a multilayer of chromium layers and chromium nitride layers may be applied and may serve as a support layer. Onto this support layer, the final functional layer providing for desired characteristics such as the friction reduction, hardness, etc. may be deposited. Preferably, this functional layer is made with diamond-like carbon or chromium nitride.

Particularly, it has been found that friction reducing characteristics of materials may vary under different conditions. For example, it has been found that both diamond-like carbon layers as well as chromium nitride layers may provide for low friction with respect to a polyurethane material of a suspension traction member under relatively humid conditions. However, at very dry conditions, friction between a chromium nitride layer and polyurethane appears to be smaller than between a diamond-like carbon layer and polyurethane. It is assumed that such differences in friction in dry conditions result from the fact that, without any water or hydrogen being present, atoms of the friction reducing coating and atoms of the adjacent polyurethane suspension traction member show a higher adhesion in case the material of the friction reducing coating has a similar atom weight as the polyurethane than in cases where the atom weights of these materials differ more. Accordingly, while both polyurethane and diamond-like carbon layers comprise significant amounts of carbon atoms which preferably adhere to each other under dry conditions thereby increasing friction, the larger difference of atom weights between the chromium and nitrogen comprised in the CrN coating, on the one hand, and the carbon comprised in the polyurethane may help reducing such friction.

According to an embodiment, the coating is electrically conductive. Preferably, an electrical resistance through the coating, i.e. from an inner surface of the coating contacting the base body to an outer surface of the coating being e.g. in contact with a suspension traction member, may be smaller than 1000Ω, preferably smaller than 300Ω. With such low electrical resistance, the coating may for example advantageously influence electrostatic charging of for example a belt forming a suspension traction member being in contact with the surface of the pulley.

Furthermore, such electrical characteristics may be a requirement for an STM monitoring system. Therein, an electrical current may be fed through cords of a belt of a suspension traction member and if these cords come into contact with the pulley's surface (e.g. due to damages in an enclosing sheath) an electrical current may be establish between the cords and the pulley. Such shunt may be detected and may indicate the damage in the belt's sheath.

It shall be noted that possible features and advantages of embodiments of the invention are described herein partly with respect to a pulley, partly with respect to an elevator comprising such pulley and partly with respect to a method for manufacturing such pulley. One skilled in the art will recognize that the features may be suitably transferred from one embodiment to another and features may be modified, adapted, combined and/or replaced, etc. in order to come to further embodiments of the invention.

In the following, advantageous embodiments of the invention will be described with reference to the enclosed drawings. However, neither the drawings nor the description shall be interpreted as limiting the invention.

The figures are only schematic representations and not to scale. Same reference signs refer to same or similar features.

DETAILED DESCRIPTION

Figure 1:
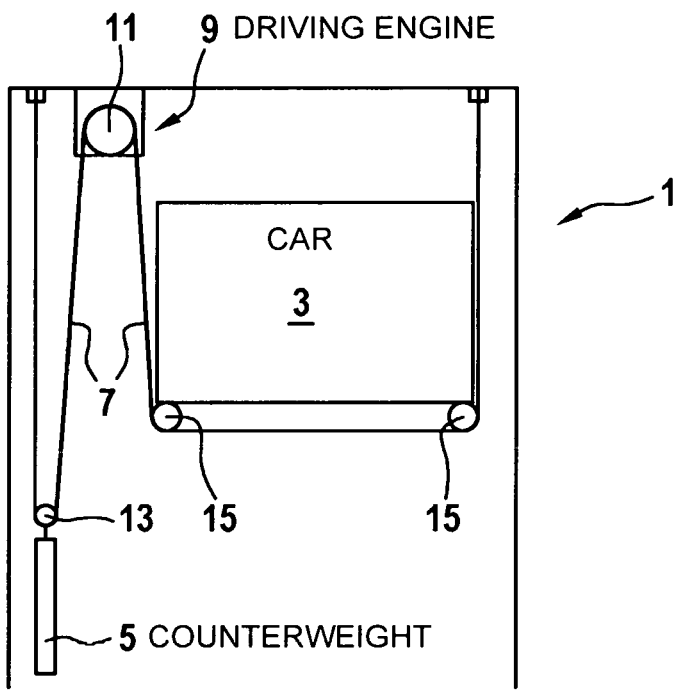
FIG. 1 shows an elevator comprising pulleys.

FIG. 1 shows basic components of an elevator 1. The elevator 1 comprises a car 3 and a counterweight 5. The car 3 and the counterweight 5 are both held by a suspension traction member 7 typically being formed by a multiplicity of elongate belts. Each belt comprises several load bearing wires enclosed in a polyurethane cover. The suspension traction member 7 may be driven by a driving engine 9 in which an electric motor may rotate a traction sheave 11. The suspension traction member 7 holds the car 3 and the counterweight 5 via pulleys 13, 15, respectively. The pulleys 13, 15 may be fixed for example to a top and/or to a bottom of the car 3 and/or counterweight 5, respectively.

In a configuration of an elevator 1 in which the traction sheave 11 shall actively displace the suspension traction member 7, i.e. the traction sheave 11 is actively driven into rotation and then shall displace the suspension traction member 7 via friction between a contact surface of the traction sheave 11 and a contact surface of the suspension traction member 7, the contact surface of the traction sheave 11 should be optimized in order to obtain a sufficiently high friction.

In contrast hereto, the pulleys 13, 15 are not actively driven, i.e. have no own driving means, but are only passively driven by the moving suspension traction member 7. Accordingly, no high friction between contact surface of the pulleys 13, 15 and the contact surface of the suspension traction member 7 is required. Instead, it has been found that low friction between the pulleys 13, 15 and the suspension traction member 7 may be beneficial in order to obtain for example good guidance characteristics for the belts of the suspension traction member 7.

Figure 2:
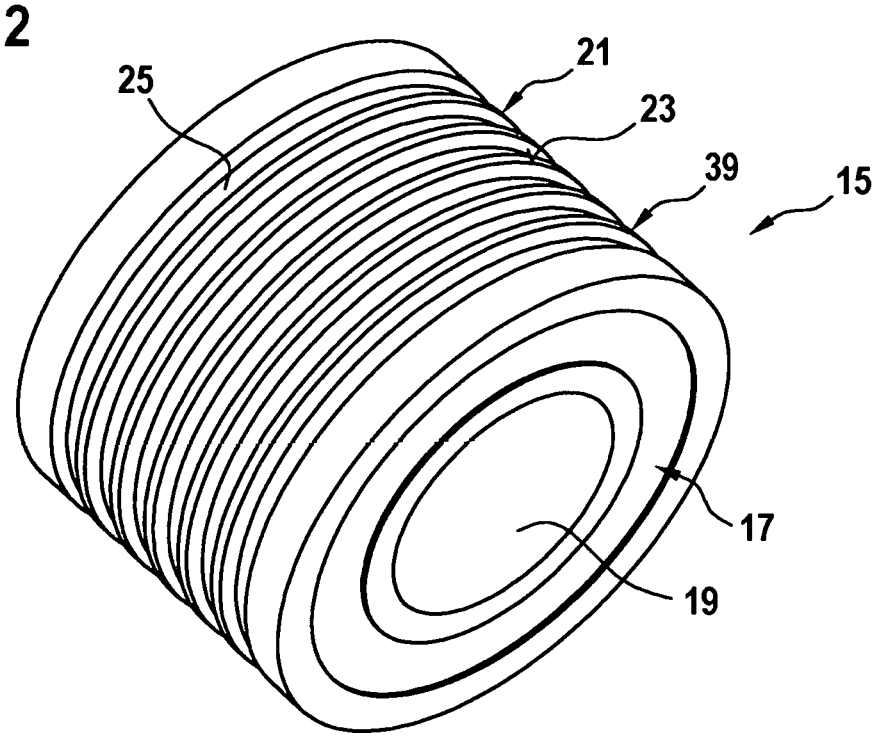
FIG. 2 shows a perspective view onto a pulley according to an embodiment of the present invention.

FIG. 2 shows a perspective view onto an exemplary pulley 15 according to an embodiment of the present invention being one of the pulleys 13, 15 shown in FIG. 1. The pulley 15 has a generally cylindrical geometry. The pulley 15 comprises a base body 17 made from solid steel. Such base body 17 comprises an inner central opening 19. A bearing (not shown) such as for example a ball-bearing may be arranged within this central opening 19. Accordingly, the pulley 15 may be attached to for example the car 3 via the bearing in a rotatable manner. A friction reducing coating 21 covers an outer circumferential surface 23 of the base body 17. Furthermore, the base body 17 comprises a surface texture at its circumferential surface 23, the surface texture comprising circumferential grooves 25 having for example a V-shaped or U-shaped cross-section.

Figure 3:
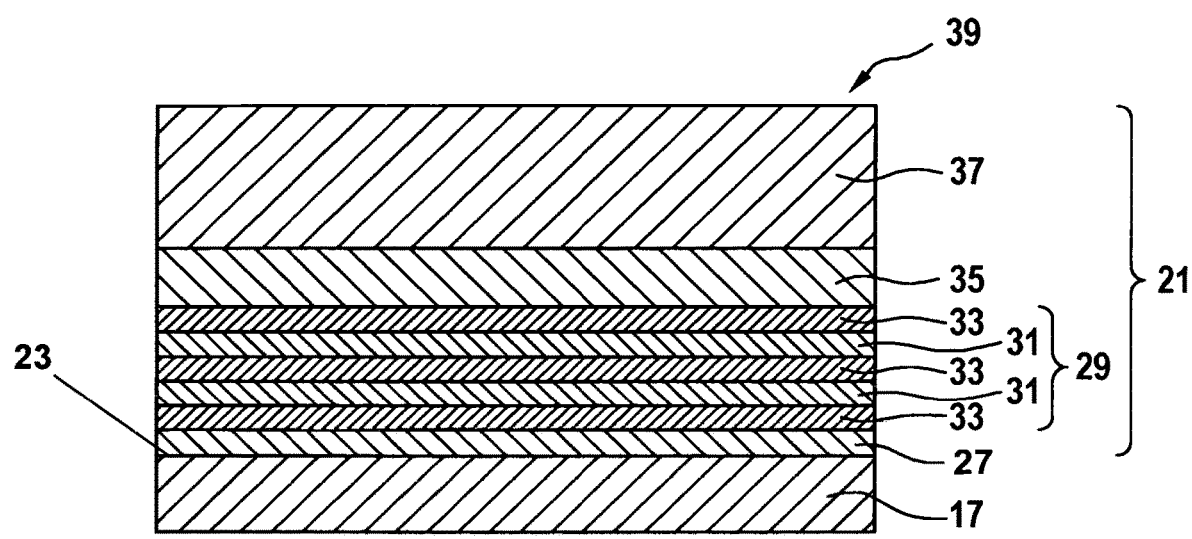
FIG. 3 shows a cross section through a coating applied to a surface of a base body for forming a pulley according to an embodiment of the present invention.

FIG. 3 shows a cross-section through an exemplary coating 21 applied to the circumferential surface 23 of the base body 17. The coating 21 comprises a multilayer structure comprising several thin layers serving for various purposes. An innermost layer 27 directly abutting to the circumferential surface 23 of the base body 17 is made from chromium (Cr) and serves as an adhesion-promoting layer. On top of this innermost layer 27, a layer stack 29 is applied, this layer stack 29 comprising several layers such as chromium layers 31 and chromium nitride layers 33. This layer stack 29 may serve as a buffering and/or supporting layer for an outermost functional layer 37. Accordingly, this layer stack 29 generally has a lower hardness than the outermost layer 37. Furthermore, an intermediate layer 35 may be interposed between the outermost layer 37 and the layer stack 29. Such intermediate layer 35 may comprise a mixture of chromium carbide and hydrogenated amorphous carbon. The outermost layer 37 may comprise chromium nitride or diamond-like carbon formed by hydrogenated amorphous carbon.

Finally, a method for manufacturing a pulley according to an embodiment of the invention will be described.

First, the base body 17 may be prepared. For such purpose, turning techniques may be applied to a raw component of massive steel such as to form, inter alia, the rotation-symmetrical circumferential surface 23 comprising the grooves 25. As a result of such turning techniques, the circumferential surface 23 may still have a relatively high surface roughness.

In order to enable subsequent low friction characteristics for the pulley 15, the circumferential surface 23 is then substantially smoothed by for example vibratory grinding and/or stream finishing. After such smoothing procedure, the circumferential surface 23 of the base body 17 has a surface roughness with a roughness value Rz of preferably less than 5 μm.

Such pre-treated and smoothed base body 17 is then cleaned for example in an ultrasonic cleaning line before subsequently depositing the friction reducing coating 21 thereon. Various layers of the friction reducing coating 21 are then deposited preferably in one or more CVD processes, particularly in one or more plasma assisted CVD processes. In the end, an outer surface of the outermost layer 37 of the friction reducing coating 21 forms an outside surface 39 of the pulley 15.

Finally, the outside surface 39 of the pulley 15 and its coating 21 may be brushed.

The entire coating process or parts thereof may be performed in a batch-type manner in which multiple base bodies 17 are stacked with their faces on top of each other and suitable layers 27, 31, 33, 35, 37 are then deposited onto their circumferential surfaces for forming the friction reducing coatings 21.

With the coated pulley 15 proposed herein, guiding characteristics of the pulley 15 may be improved and/or alignment requirements upon installation of the pulley 15 may be relaxed. Preferably, the coating 21 may comprise diamond-like carbon (DLC) such that the coating 21 may provide for superior wear resistance, slickness, corrosion protection and electrical characteristics.

Finally, it should be noted that the term "comprising" does not exclude other elements or steps and the "a" or "an" does not exclude a plurality. Also elements described in association with different embodiments may be combined.

In accordance with the provisions of the patent statutes, the present invention has been described in what is considered to represent its preferred embodiment. However, it should be noted that the invention can be practiced otherwise than as specifically illustrated and described without departing from its spirit or scope.

LIST OF REFERENCE SIGNS 1 elevator
3 car
5 counterweight
7 suspension traction member
9 driving engine
11 traction sheave
13 pulley
15 pulley
17 base body
19 central opening
21 coating
23 circumferential surface
25 circumferential grooves
27 innermost layer
29 layer stack
31 chromium layer
33 chromium nitride layer
35 intermediate layer 37 outermost layer
39 outside surface of the coating

The invention claimed is:

1. A pulley for an elevator, the pulley comprising:
a base body having a rotation-symmetrical circumferential surface; and
a friction reducing coating applied to the circumferential surface of the base body,
wherein the coating has a multilayer structure with an inner layer having a lower hardness than an outer layer.

2. The pulley according to claim 1 wherein the coating is a thin film layer on the circumferential surface.

3. The pulley according to claim 1 wherein the coating comprises at least one layer of a diamond-like carbon material or a chromium nitride material.

4. The pulley according to claim 1 wherein the coating has a static coefficient of friction to steel of between 0.02 and 0.2.

5. The pulley according to claim 1 wherein the coating has a homogeneous thickness throughout the circumferential surface of the base body.

6. The pulley according to claim 5 wherein the homogeneous thickness of the coating is between 1 μm and 10 μm.

7. The pulley according to claim 1 wherein the circumferential surface of the base body has a surface texture with circumferential grooves, the grooves having a cross-section forming a non-flat circumferential surface of the base body.

8. The pulley according to claim 7 wherein the grooves have one of a V-shaped cross section and a U-shaped cross section.

9. The pulley according to claim 1 wherein the circumferential surface of the base body has a surface roughness with a roughness value smaller than 5 μm.

10. The pulley according to claim 1 wherein an outside surface of the coating has a surface roughness with a roughness value smaller than 2 μm.

11. The pulley according to claim 1 wherein the coating has a microhardness of at least 10 GPa.

12. The pulley according to claim 1 wherein the inner layer is a layer stack formed from at least one of chromium material, chromium nitride material, chromium carbide material and hydrogenated amorphous Carbide material.

13. The pulley according to claim 1 wherein the coating is electrically conductive.

14. An elevator comprising at least one of a car and a counterweight being held by a suspension traction member via the pulley according to claim 1.

15. A method for manufacturing a pulley for an elevator, the method comprising the steps of:
providing a base body having a rotation-symmetrical circumferential surface; and
applying a friction reducing coating to the circumferential surface of the base body,
wherein the coating has a multilayer structure with an inner layer having a lower hardness than an outer layer.

16. The method according to claim 15 including applying the coating using chemical vapor deposition.

17. The method according to claim 16 wherein the chemical vapor deposition is plasma assisted chemical vapor deposition.

18. The method according to claim 15 including, prior to applying the coating, smoothing the circumferential surface of the base body to a surface roughness with a roughness value of ≤5 μm.

19. The method according to claim 15 including, prior to applying the coating, smoothing the circumferential surface of the base body by performing at least one of vibratory grinding, stream finishing and glass bead blasting.

* * * * *